(12) United States Patent
Wegmann et al.

(10) Patent No.: US 7,277,182 B2
(45) Date of Patent: Oct. 2, 2007

(54) APPARATUS FOR POLARIZATION-SPECIFIC EXAMINATION, OPTICAL IMAGING SYSTEM, AND CALIBRATION METHOD

(75) Inventors: Ulrich Wegmann, Koenigsbronn (DE); Markus Mengel, Heidenheim (DE)

(73) Assignee: Carl Zeiss SMT AG, Oberkochen (DE)

( * ) Notice: Subject to any disclaimer, the term of this patent is extended or adjusted under 35 U.S.C. 154(b) by 200 days.

(21) Appl. No.: 10/883,739

(22) Filed: Jul. 6, 2004

(65) Prior Publication Data
US 2005/0146789 A1 Jul. 7, 2005

Related U.S. Application Data

(63) Continuation-in-part of application No. PCT/EP03/07203, filed on Jul. 5, 2003.

(51) Int. Cl.
*G01B 9/02* (2006.01)
*G01J 4/00* (2006.01)

(52) U.S. Cl. ........................................ 356/494; 356/491
(58) Field of Classification Search ............... 356/364, 356/365, 369, 491, 494, 515, 521
See application file for complete search history.

(56) References Cited

U.S. PATENT DOCUMENTS

| | | | |
|---|---|---|---|
| 5,257,131 A * | 10/1993 | Yoshida et al. | 359/485 |
| 5,333,052 A * | 7/1994 | Finarov | 356/369 |
| 5,392,119 A | 2/1995 | McArthur et al. | |
| 5,640,233 A | 6/1997 | McArthur et al. | |
| 5,866,935 A | 2/1999 | Sogard | |
| 5,900,939 A | 5/1999 | Aspnes et al. | |
| 5,929,991 A | 7/1999 | McArthur et al. | |
| 5,978,085 A | 11/1999 | Smith et al. | |
| 6,014,359 A * | 1/2000 | Nagano | 369/112.07 |
| 6,312,373 B1 | 11/2001 | Ichihara | |
| 6,344,898 B1 | 2/2002 | Gemma et al. | |
| 2002/0191185 A1 | 12/2002 | Rotter et al. | |

(Continued)

FOREIGN PATENT DOCUMENTS

DE 101 09 929 A1 11/2001

(Continued)

OTHER PUBLICATIONS

Jay S. Van Delden, Ortho-Babinet polarization-interrogating filter: an interferometric approach to polarization measurement, Optics Letters, Jul. 15, 2003, pp. 1173-1175, vol. 28, No. 14.

(Continued)

*Primary Examiner*—Gregory J. Toatley, Jr.
*Assistant Examiner*—Michael A Lyons
(74) *Attorney, Agent, or Firm*—Sughrue Mion Pllc.

(57) ABSTRACT

A device for polarization-specific examination of an optical system having a detector part that has polarization detector means for recording the exit state of polarization of radiation emerging from the optical system. Also, an associated optical imaging system, and a calibration method for the device. The device includes a polarization detector with a polarizing grating structure. Provided as an alternative is a device for snapshot polarimetry having a birefringent element and downstream polarizer element that adequately polarizes nonquasi-parallel radiation. The device may be used for determining the influence on the state of polarization of UV radiation by a microlithographic projection objective.

28 Claims, 3 Drawing Sheets

U.S. PATENT DOCUMENTS

2003/0072079 A1    4/2003    Silverstein et al.

FOREIGN PATENT DOCUMENTS

| DE | 102 17 242.0 | 4/2002 |
| DE | 103 04 822.7 A1 | 2/2004 |
| JP | 111 42 291 A | 5/1999 |
| WO | WO 02/42728 A | 5/2002 |
| WO | WO 03/077011 A1 | 9/2003 |

OTHER PUBLICATIONS

M. Totzeck, et al., Inspection of subwavelength structures and zero-order gratings using polarization-interferometry, Proceedings of SPIE, 2002, pp. 330-344, vol. 4777.

Mike Gruntman, Transmission grating filtering of 52-140-nm radiation, Applied Optics, Apr. 1, 1997, pp. 2203-2205, vol. 36, No. 10.

Bernd Schnabel, et al., Study on polarizing visible light by subwavelength-period metal-stripe gratings, Optical Engineering, Feb. 1999, pp. 220-226, vol. 38, No. 2.

Daniel Malacara, Optical Shop Testing, 1992, pp. 112-113, John Wiley and Sons, Inc., New York, USA.

Lucila H. Cescato et al., Holographic quaterwave plates, Applied Optics, Aug. 1, 1990, pp. 3286-3290, vol. 29, No. 22.

M. Honkmanen et al., Inverse metal-stripe polarizers, Applied Physics B, Springer-Verlag 1999, Aug. 1998, vol. 68, pages pp. 81-85.

\* cited by examiner

APPARATUS FOR POLARIZATION-SPECIFIC EXAMINATION, OPTICAL IMAGING SYSTEM, AND CALIBRATION METHOD

CROSS-REFERENCE TO RELATED APPLICATIONS

This application is a Continuation-in-Part Application of International Patent Application No. PCT/EP03/07203, filed on Jul. 5, 2003, the disclosure of which is hereby incorporated by reference in its entirety.

BACKGROUND OF THE INVENTION

1. Field of the Invention

The invention relates to a device for polarization-specific examination of an optical system, having a detector part that comprises polarization detector means for recording the exit state of polarization of radiation emerging from the optical system, to an optical imaging system having such a device, and to an associated calibration method.

In particular, such a device can be used to determine how an optical system influences the state of polarization of optical radiation. These types of device are known for this purpose. The term optical system is to be understood in this case as any arrangement of one or more optical components which transmit and/or reflect the incident optical radiation, in particular including lenses and objectives constructed therewith. The term optical radiation is to be understood here as any desired electromagnetic radiation which is applied to the optical system under examination, for example visible light or UV radiation. Particularly widely used are ellipsometry methods and ellipsometry apparatuses in diverse forms. In order to describe the state of polarization and how it is influenced or changed by the optical system, use is made of suitable variables such as the Stokes parameters, the Müller matrix, the polarization matrix and the Jones matrix. Reference may be made to the relevant literature for details in this regard.

2. Description of the Related Art

As is known, it is possible for the purpose of determining the image quality of optics which image with high precision to make use of wavefront sensors with the aid of which deviations of the image-side wavefronts from the ideal imaging behavior can be determined very accurately. So-called shearing interferometers, for example, are in use for this purpose. A wavefront detection device based thereon is disclosed in laid-open specification DE 101 09 929 A1. This device is also suitable, in particular, for determining the image quality of projection objectives of microlithographic projection exposure machines, and includes means for providing a wavefront source, for example with a light guide and a shadow mask arranged at the output thereof, in the object plane of the optical imaging system under examination and a diffraction grating in the image plane conjugate to the object plane. Connected downstream of the diffraction grating is a spatially resolving radiation detector, for example in the form of a CCD chip, an interposed optical system imaging the interferogram produced by the diffraction grating onto the sensor surface of the detector. This type of wavefront sensor technology can examine the imaging system with the aid of the same radiation which is used by the imaging system in its normal operation. This type of wavefront sensor is therefore also denoted as an operational interferometer (OI) and can, in particular, be integrated in a module with the imaging system.

In German patent application 102 17 242.0, which is not a prior publication, a measuring device is described which can, in particular, be such an OI device and serves the purpose of interferometric measurement of an optical imaging system which is used for imaging a useful pattern, provided on a mask, into the image plane, the mask being arranged in the object plane for this purpose. It is proposed to implement the wavefront source for the interferometric measurement by means of a measuring pattern formed on the mask in addition to the useful pattern.

A further method, used in practice, of wavefront detection by high-precision imaging systems is represented by point diffraction interferometry, the basic principles of which are described in the relevant specialist literature—see, for example, D. Malacara, "Optical Shop Testing", Chapter 3.7, John Wiley, New York, 1991. Specific discussions are provided in patent specifications U.S. Pat. No. 6,344,898 B1 and U.S. Pat. No. 6,312,373, and in the laid-open specifications JP 11-142291 and WO 02/42728. Further methods used for determining and/or correcting aberrations of high-precision imaging systems are, for example, the Shack-Hartmann method and the so-called Litel method, used by Litel Instruments—for the latter see, for example, patents U.S. Pat. No. 5,392,119, U.S. Pat. No. 5,640,233, U.S. Pat. No. 5,929,991 and U.S. Pat. No. 5,978,085. These interferometric and non-interferometric measuring methods can be used, in particular, to determine aberrations for projection objectives of microlithographic projection exposure machines.

In the case of modern high-precision imaging systems of high numerical aperture, used as microlithographic projection objectives, for example, the influence of the imaging system on the state of polarization of the radiation used can scarcely be neglected any longer. Thus, for example, polarization-induced effects on the image quality are produced by birefringence in the case of lenses made from calcium fluoride such as are frequently used for short wavelengths, and by polarization effects at deflecting mirrors. There is therefore a need to be able to determine the influencing of the state of polarization of optical imaging systems of high aperture as well as possible in quantitative terms, in order to draw conclusions on the polarization-dependent image quality.

Various devices for determining the influencing of the state of polarization by an optical system, and polarization analyzer arrangements suitable therefor are described in the older German patent application 103 04 822.7, which is not a prior publication and whose content is hereby incorporated in full by reference. The device described there and the method described there can be used for example, to determine the phase-reduced or complete Jones matrix of an examined optical imaging system, in particular also of high-aperture microlithographic projection objectives, in a pupil-resolved fashion. The polarization detector means of the detector part, which is arranged on the image side of the examined optical imaging system, there have a compensator polarizer unit, typically in the form of a $\lambda/4$ plate, with a downstream polarization analyzer element, typically in the form of a polarization beam splitter element, and an upstream, collimating optical system, in order to reshape the aperture beam emerging from the examined optical imaging system into a parallel beam required for the polarization analyzer element. Such a collimating optical system records a corresponding overall height of the detector part. Alternatively specified polarization detector means include small refractive or diffractive lenses with a downstream miniaturized polarization splitter cube. Such miniaturized optical components are however, relatively complicated to produce.

In the German article by J. S. Van Delden entitled Ortho-Babinet polarization-interrogating filter: an interferometric approach to polarization measurement, Optics Letters, Volume 28, No. 14, 15 Jul. 2003, page 1173, a description is given of an imaging Stokes polarimetry technique using an OBPI filter, with the aid of which all four Stokes parameters, and thus the state of polarization of the radiation can be determined over the entire image in a spatially resolved fashion without movable parts for imaging radiation incident in a quasi-parallel fashion. This OBPI method only requires a single picture record, and this is also denoted as snapshot polarimetry. The OBPI filter includes two retarder elements that in each case comprise a pair of uniaxial, linearly birefringent wedge elements, and are connected in series with the aid of wedge angles rotated by 90° to one another, and also a downstream linear polarizer. The two birefringent wedge plate retarders produce a change in the retardation of penetrating radiation that rises linearly in space in two dimensions. The downstream linear polarizer converts this retardation variation into a spatially oscillating brightness distribution. The result for prescribable, pure state of polarization of the incident radiation is different periodic structural patterns of the intensity distribution that serve as basic or reference patterns. It is then possible with the aid of the latter to determine the unknown state of polarization of an image of low-aperture imaging by reconstructing the fractions of the various reference patterns from the measured structural pattern by means of a suitable evaluation method. When the reference patterns are determined experimentally, they simultaneously also include some instrumentally induced, non-ideal influences, the result being to provide internal calibration.

SUMMARY OF THE INVENTION

The invention is based on the technical problem of providing a device of the type mentioned at the beginning with the aid of which it is possible to examine an optical system in a polarization-specific fashion, in particular with regard to the influencing of the state of polarization of the radiation used by the examined optical system, and that can be implemented with a comparatively low overall height and can be used, for example, for pupil-resolved determination of the polarization-induced influencing of the image quality in the case of high-aperture microlithographic projection objectives. Further objects of the invention are the provision of a calibration method for such a device, and of an optical imaging system that can be operated depending on the measurement results of such a device.

The invention solves this problem by providing a device for polarization-specific examination of an optical system, having a detector part with polarization detector means for recording an exit state of polarization of radiation emerging from the optical system, characterized in that the polarization detector means include a polarizing grating structure. The device may determine an influencing of the state of polarization of the radiation by the optical system. The device may be a shearing interferometry, point diffraction interferometry, Shack-Hartmann or Litel type device, and/or the device may be set up for a pupil-resolved determination of the influencing of the state of polarization of the radiation by a microlithographic projection objective.

Further, the invention provides an optical imaging system having one or more optical elements, of which at least one can be set variably, a device for the polarization-specific examination of the imaging system, and a control loop for setting the at least one settable optical element as a function of a measurement result of the device for the polarization-specific examination of the imaging system. The optical imaging system may be for a microlithography projection exposure machine. The invention also provides a method for calibrating a device for polarization-specific examination of an optical system, having the steps of (a) providing a quasi-parallel calibration beam with a set state of polarization, (b) using a high-aperture optical system to reshape the quasi-parallel calibration beam into a convergent calibration beam that is coupled into the polarization examination device, (c) recording the image of the structural pattern produced for the set state of polarization by means of the polarization examination device, and using the said image as calibrating reference pattern, and (d) repeating steps a to c once or several times for in each case on another set state of polarization.

The inventive use of a polarizing grating structure in the polarization detector means permits a comparatively compact and simple implementation of the detector part of the device for polarization-specific examination of optical systems. In particular, it is possible thereby to eliminate an upstream collimating optical system, and neither is there an illustratable need for small lenses and miniaturized polarization beam splitter elements. Nevertheless, the device is also specifically suitable for pupil-resolved determination of the influencing of the state of polarization of optical radiation with a microlithographic projection objective of high aperture, in particular also including in the UV wavelength region, it being possible for the detector part of compact design to be placed without any problem on the image side of the projection objective at the location of the same in a corresponding microlithographic projection exposure machine. All the aperture beams can be analyzed under varying incidence on the polarizing grating structure without the specific need for a collimating optical system. Otherwise, the device can be constructed for this application in one of the conventional ways in order to measure the objective by means of an appropriate technique, for example by shearing interferometry, point diffraction interferometry, using the Shack-Hartmann or the Litel methods.

In particular, in a development of the invention the detector part of the device can for this purpose comprise a periodic diffraction structure for providing an appropriate diffraction effect. The diffraction structure can be implemented, for example, by a diffraction grating whose grating period is then typically substantially larger than the wavelength of the radiation used, and thereby has an effect which while being polarizing is not markedly so. In the case of an examined optical imaging system, the periodic diffraction structure can advantageously be arranged substantially in the image plane of said system, and/or the polarizing grating structure can be arranged close to the image plane.

Depending on what is required, the periodic diffraction structure and the polarizing grating structure can be arranged in each case on a dedicated carrier or on a common carrier, in the latter case, for example, one structure on a front side, and the other structure on a rear side of the common carrier.

In an advantageous refinement of the invention, the device of shearing interferometry, point diffraction interferometry, Litel or Shack-Hartmann type is set up and/or to determine the influencing of the state of polarization of optical radiation through a microlithographic projection objective.

In a further aspect, the invention comprises a device for polarization-specific examination of an optical system, in particular of a high-aperture optical imaging system having polarization detector means that include a birefringent element for varying as a function of beam angle, the retardation of the radiation emerging from the optical system, and having a downstream polarizer element that is suitable for also adequately polarizing such radiation as is not incident in a quasi-parallel fashion on the birefringent element and emerges from the latter. Here, the term "nonquasi-parallel" signifies radiation with incidence angles of typically more than 5° and, in particular, of up to approximately 60° and more, and they are supplied, for example, by a high-aperture imaging system. The designation "adequately polarized" signifies that the polarizer element polarizes the radiation coming from the birefringent element with an extension ratio that is sufficiently large to be able to use the radiation supplied from the polarizer element to determine the state of polarization of the incident radiation with the desired, prescribable accuracy. This device is suitable with particular advantage for pupil-resolved snapshot polarimetry on high-aperture imaging systems for example by microlithographic projection objectives, without moving parts, specifically also on high-aperture imaging systems that operate with UV radiation.

In a development of this device, the polarizer element downstream of the birefringent element is a polarizing grating. This is capable also of polarizing with an adequate extension ratio UV radiation with strongly non-parallel incident angles, in particular UV radiation from a high-aperture imaging system.

In both of the above aspects, the invention also permits the polarization-specific examination precisely of optical systems that operate with radiation in the wavelength region below approximately 400 nm and, in particular, in the UV region from approximately 140 nm to approximately 200 nm or below 140 nm. In this case, the use of the polarizing grating as polarizer element is particularly expedient for the purpose of polarization-specific examination of high-aperture imaging systems.

In a further aspect, the invention provides an optical imaging system, in particular for a microlithographic projection exposure machine, that is assigned an inventive device for polarization-specific examination as part of a control loop with the aid of which at least one optical element of the imaging system is set as a function of a measurement result of the polarization examination device. This permits a readjustment of the imaging system as a reaction to the measured influence of the state of polarization of the radiation used during imaging operation when the imaging system is used operationally.

The invention further comprises a suitable calibration method for the inventive polarization examination device in the case of which the polarization detector means comprise the birefringent element and the downstream polarizer element, specifically for the use of this device in the examination of a high-aperture imaging system. For this purpose, in the case of a quasi-parallel calibration beam various defined states of polarization are set one after another, and the calibration beam is reshaped by means of a high-aperture optical system. For each set state of polarization, the image of the structural pattern resulting therefrom is recorded such that the images of structural pattern thus determined can serve as a reference in evaluating images of structural pattern which are measured with the aid of the polarization examination device for unknown states of polarization of radiation that is supplied, for example, by a high-aperture microlithographic projection objective. The calibration method can be executed experimentally or by a simulation.

BRIEF DESCRIPTION OF THE DRAWINGS

Advantageous embodiments of the invention are illustrated in the drawings and described below. In the drawings.

DETAILED DESCRIPTION OF EXEMPLARY EMBODIMENTS OF THE INVENTION

Figure 1:
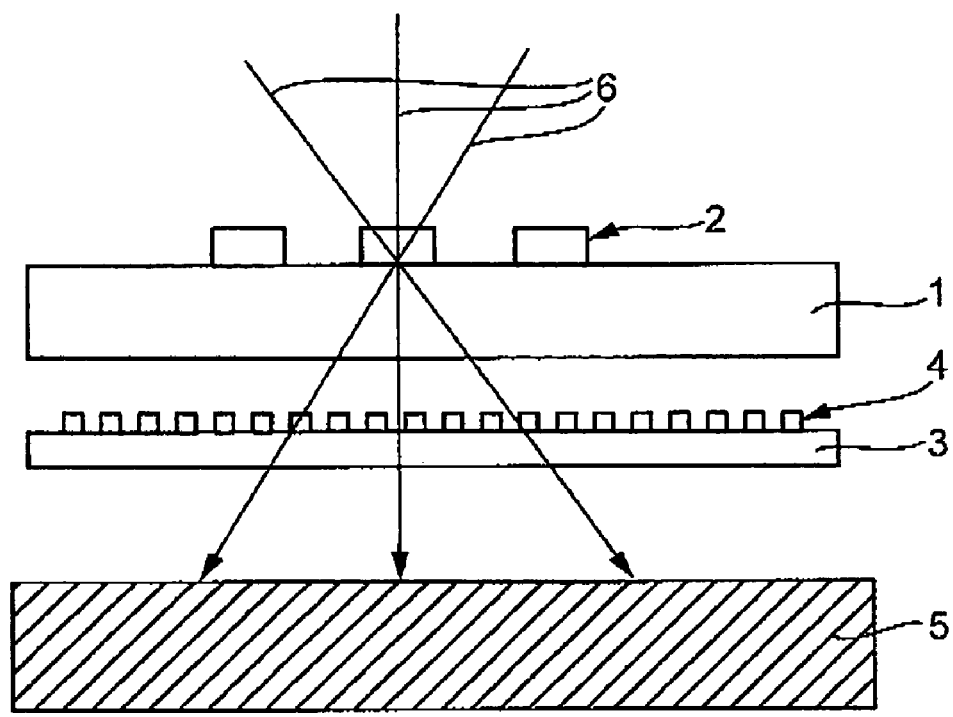
FIG. 1 shows a schematic side view of the inventive part of a device for polarization-specific examination of an optical system for the use of a detector part with a periodic diffraction structure and a polarizing grating structure for a dedicated structure carrier in each case.

FIG. 1 shows that part of a device for polarization-specific examination of an optical system that is presently of particular interest, it being possible specifically to design the device for pupil-resolved determination of the influencing of the state of polarization of optical radiation by a microlithographic projection objective of high aperture. More precisely, FIG. 1 shows a device part that is arranged on the image side of an optical imaging system in the case of examination of the latter and which has a detector part that includes specific polarization detector means.

In detail, the device part shown in FIG. 1 includes a first grating carrier 1 having a diffraction grating structure 2 arranged on its front side, a second grating carrier 3 with a polarizing grating structure 4 arranged on the front side thereof, and a detector element 5 that can be found, for example, by a CCD chip of an imaging camera. The first carrier 1 with the diffraction grating structure 2, the second carrier 3 with the polarizing grating structure 4 and the detector element 5 are arranged one behind another in the beam path of the radiation 6 to be analyzed that emerges from the optical system to be examined.

In a preferred implementation, the device in accordance with FIG. 1 serves the purpose of pupil-resolved measurement of a microlithographic projection objective by means of shear interferometry with the use of radiation of the same wavelength as is used in the associated projection exposure machine in normal exposure operation, for example for wafer exposure, that is to say as an AI. For the sake of clarity, FIG. 1 does not illustrate the projection objective nor that part of the measuring device located on the object side of said objective, the object-side device part having a conventional design, which depends on the measuring methods selected, that therefore requires no further explanation. It is possible for this purpose to refer, for example, to the abovementioned older German patent application 103 04 822.7.

In the said case of application of the objective measurement by means of shearing interferometry, the diffraction grating 2 functions as an associated shearing interferometry diffraction structure, for which purpose it preferably has a grating periodicity that is substantially larger than the wavelength of the radiation 6 used, as is known to the person skilled in the art. Different therefrom, the polarizing grating structure 4 has a grating periodicity of at most the order of magnitude of the radiation wavelength used. Such polarizing grating structures may be implemented in practice also for typical UV radiation wavelengths of high-resolution microlithographic projection exposure machines, such as in the range from approximately 140 nm to 200 nm, for example by means of a grating structure made from gold with a thickness of approximately 90 nm to 100 nm and a grating periodicity of likewise approximately 90 nm to 100 nm on a thin quartz carrier, or by means of a self-supporting nickel grating with a thickness and periodicity of the nickel metal strips of in each case approximately 100 nm, some of which signifies structural widths of approximately 50 nm.

As illustrated in FIG. 1 with the aid of a middle and two edge beams of the radiation 6, machining interferometry diffraction structure 2 is preferably arranged in the image plane of the examined objective, while polarizing grating structure 4 is placed at a short distance therefrom between the diffraction grating 2 and the detector element 5. Other positionings of the two periodic structures 2, 4 are possible depending on what is required and the application, it being possible for the polarizing grating structure 4 also to be arranged alternatively upstream of the diffraction structure 2 instead of downstream, as shown.

As may be seen from FIG. 1, apart from the polarizing grating structure 4 the device shown does not require in the detector part any further optical components between the diffraction structure 2 and the detector element 5, in particular no collimating optical components are required. This permits a compact design of the detector part with a low overall height such that the detector part can be placed on the image side of the inspected objective without problems of insufficient space, in particular also at the position of the projection objective in the associated projection exposure machine. All the aperture rays of the projection objective, typically having a relatively high numerical aperture, with aperture angles of up to 60° and more can be recorded for a varying incidence on the polarizing grating 4 of the downstream detector element 5, and can be analyzed in a pupil-resolved fashion by an associated conventional evaluation unit (not shown).

Investigations show that with such a device for the polarizing grating 4, operating with high incidence angles, in the detector part, it is possible, for example, to determine the Jones matrix with adequate accuracy, specifically also for the abovementioned UV wavelengths, of particular interest for microlithography, in the region between approximately 140 nm and 200 nm.

Figure 2:
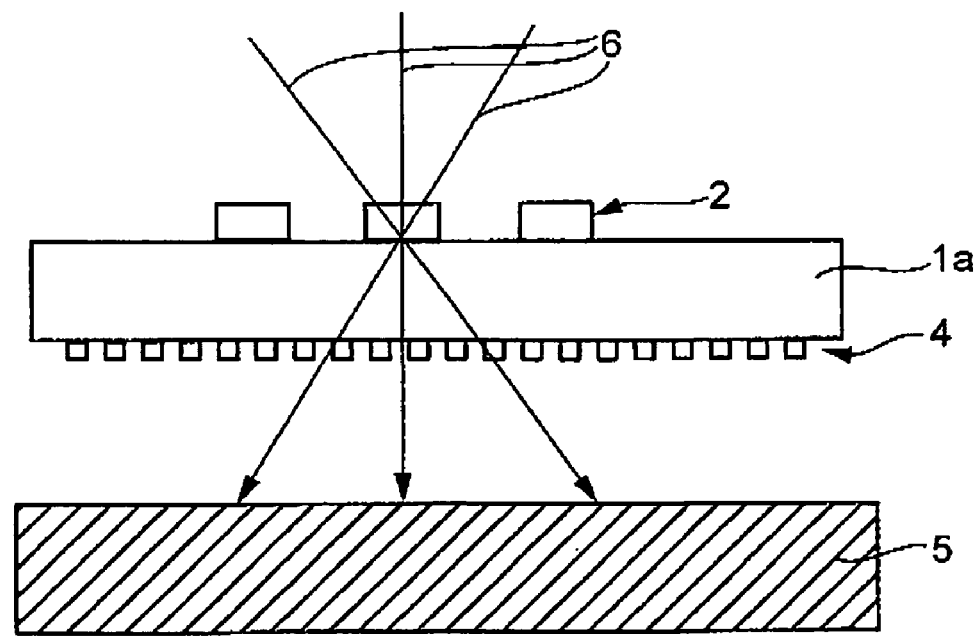
FIG. 2 shows an illustration corresponding to FIG. 1 for a variant with the common carrier for the periodic diffraction structure and the polarizing grating structure.

FIG. 2 shows a variant of the device of FIG. 1 that differs from the latter in that the diffraction structure 2 and the polarizing grating structure 4 are arranged on the common carrier 1a, the same reference numerals being selected for functionally equivalent elements, and it being possible to this extent to refer to the above description of FIG. 1.

In the example of FIG. 2 that is shown, the diffraction structure 2 is located on the front side, and the polarizing grating structure 4 is located on the rear side of the common carrier 1a. For the purposes of production, it is possible for example, firstly to produce the diffraction structure 2 on the front side of the carrier 1a, as subsequently to fix the polarizing grating 4 as prefabricating structure on the rear side of the carrier 1a for example by wringing.

For the rest, it is clearly to be seen that the same properties, possibilities of use and advantages arise for the device of FIG. 2 as mentioned above in relation to the device of FIG. 1, to which reference may be made.

The use of the inventive device for polarization-specific, pupil-resolved shearing interferometric measurement of a high-aperture microlithographic projection objective is explained above by way of example. However, it goes without saying that, given an appropriate design, the inventive device is also suitable for any other polarization-specific examinations of objectives and other optical systems. In particular, the device can also be designed, with the detector part, which is to be of compact design, with a polarizing grating for the purpose of measuring and/or correcting a microlithographic projection objective or another optical imaging system by using the point diffraction interferometry, Shack-Hartmann or Litel methods with regard to imaging aberrations.

Figure 3:
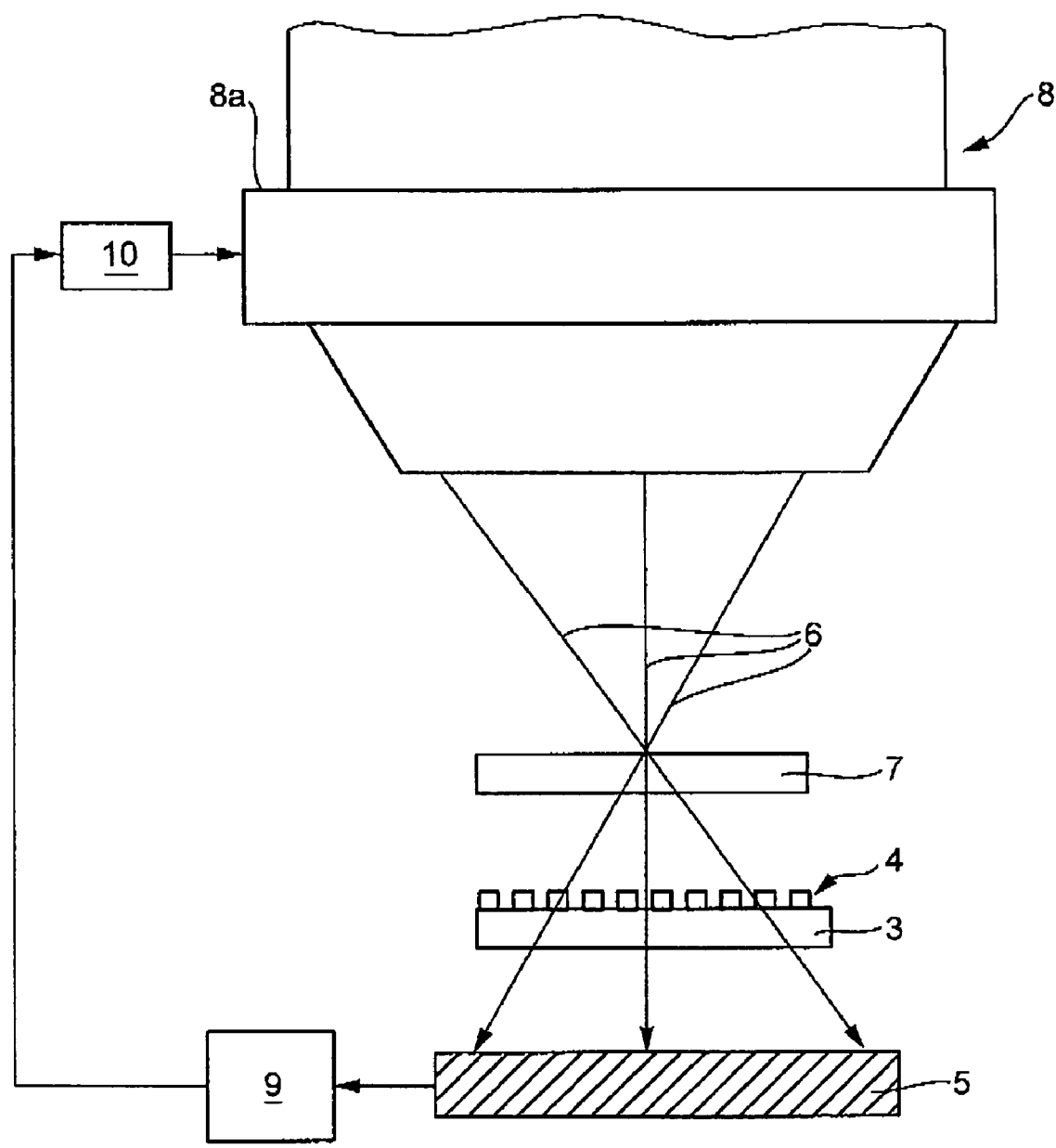
FIG. 3 shows an illustration corresponding to FIG. 1 for a variant that permits snap-shot polarimetry and comprises a birefringent element and a polarizing grating structure.

FIG. 3 shows a further device for polarization-specific examination of an optical system that is suitable for snapshot polarimetry without moving parts. The device of FIG. 3 corresponds to a certain extent in its design, its mode of operation and the advantages associated therewith to the device of FIG. 1, and so to this extent reference may be made to the above description unless otherwise stated.

By contrast to the device of FIG. 1, instead of the diffraction grating structure 2 the device of FIG. 3 has a single birefringent element 7, for example a birefringent plane plate. This birefringent element 7 acts like a two-dimensional variation of the retardation of the high-aperture beam 6 that emerges from a high-aperture imaging system 8 shown here. In turn, the imaging system 8 can be, in particular, a microlithographic projection objective of high aperture. Like that of FIG. 1, the device of FIG. 3 includes, downstream of the birefringent element 7, the polarizing grating structure 4 on the grating carrier 3, and the detector element 5.

The mode of operation of the device of FIG. 3, and the evaluation of the results of the measurement of the state of polarization which this device can obtain by means of snapshot polarimetry with the aid of a single picture record without moving parts correspond to the method of operation and the evaluation method of the OBPI method such as are described in the abovementioned journal article by J. S. Van Delden and the literature cited there, and this reference may be made for further details in this case, and for which reason the content of this journal article is fully incorporated herein by reference. By contrast of the device described there, however, the device of FIG. 3 is also suitable and designed for determining the state of polarization for radiation with noticeably non-parallel incidence angles, such as the imaging beam 6 emerging from the high-aperture imaging system 8. These are to be understood as incidence angles of at least approximately 5° and typically up to 60° or more, such as are present, for example, with high-aperture microlithographic projection objectives. The device of FIG. 3 is also particularly suitable for radiation in the UV wavelength region, for example with wavelengths of between approximately 140 nm and approximately 200 nm or below 140 nm, such as are increasingly being used as exposure radiation in microlithographic projection exposure machines.

The beam 6 of a puntiform image, produced by the high-aperture imaging system 8, traverses the strongly birefringent element 7. The radiation 6 undergoes a variation in its retardation, since the path length and the orientation for the various beams change with reference to the main axes of the birefringent elements 7 as a function of beam angle. As in the case of the conventional OBPI method, the variation retardation is converted into a brightness modulation by the downstream polarizer element in the form of the polarizing grating element 3, 4, thus producing in the image plane a structure pattern that depends on the state of polarization and is recorded by the detector element 5. The polarizer element 3, 4 is designed such that it polarizes the variation with a sufficient extension ratio even given the comparatively high incidence angles present here. The polarizing grating structure 4 is capable of this specifically in the UV wavelength region, whereas crystal optical components can polarize with a sufficient extension ratio typically only up to incidence angles of at most approximately 5°. The evaluation of the structural patterns recorded by the detector element 5 is then performed as in the case of the conventional pattern OBPI method, to which reference may be made and which therefore requires no further explanation here. Since the change in the incidence angle at the birefringent element 7 is much smaller in the vicinity of the middle beam than in the vicinity of edge beams, structural patterns in the image plane that are markedly inhomogeneous in states occur by contrast with the OBPI method. This can be corrected, if required, for example by a computational equalization with the aid of an equalization algorithm known to a person skilled in the art.

As in the case of the device of FIG. 1, for example, a CCD element of an imaging camera is suitable as detector element 5. Alternatively, it is possible to use a photofilm that is exposed, after which the images of structural patterns produced on it can be suitably evaluated. The use of this variant is facilitated in the case of the device of FIG. 3 by virtue of the fact that in accordance with the snapshot polarimetry technique only a single picture record is required. Depending on the wavelength range of the radiation that is used, instead of the polarizing grating structure 4 it is also possible to use other polarizer elements that are suitable for sufficiently polarizing radiation emerging from the birefringent element even for markedly non-parallel incidence angles.

Thus, the device of FIG. 3 facilitates an imaging, pupil-resolved Stokes polarimetry over the entire pupil of a high-aperture imaging system in a very compact design with a very simple picture recording procedure for which a single exposure suffices, without a mandatory requirement for moving components or microscope optics, or for an additional ellipsometric measurement at at least one beam, for example, the axial beam. There is no problem in carrying out the associated evaluation algorithms with the aid of the computer capacities typically available, for which the control/evaluation unit 9 is correspondingly designed.

FIG. 3 illustrates, furthermore, the use of the device for examining the state of polarization in a control loop for the imaging system 8. The control loop includes a control/evaluation unit 9 that is provided with the measuring signal of the detector element 5, and which evaluates it in the abovementioned way. Depending on the influencing thereby determined for the state of polarization of the radiation 6 by the imaging system 8, the control/evaluation unit 9 drives a manipulator unit 10 of the imaging system 8. The manipulator unit 10 includes one or more manipulators for setting one or more settable components 8a of the imaging system 8. In the case of a microlithographic projection objective 8, this can be one or more xy- and/or z-manipulators for setting lens elements of the objective 8 in the z-direction parallel to the optical axis, or in the xy-transverse plane perpendicular thereto. In this way, it is possible, if required, for the imaging properties of the imaging system 8 to be readjusted during its use in imaging mode by taking account of its influence on the state of polarization of the radiation 6 used for imaging. Obviously, instead of the device of FIG. 3 it is also possible, if required, for the device of FIG. 1 to be integrated in this way in a control loop for the imaging system 8.

Figure 4:
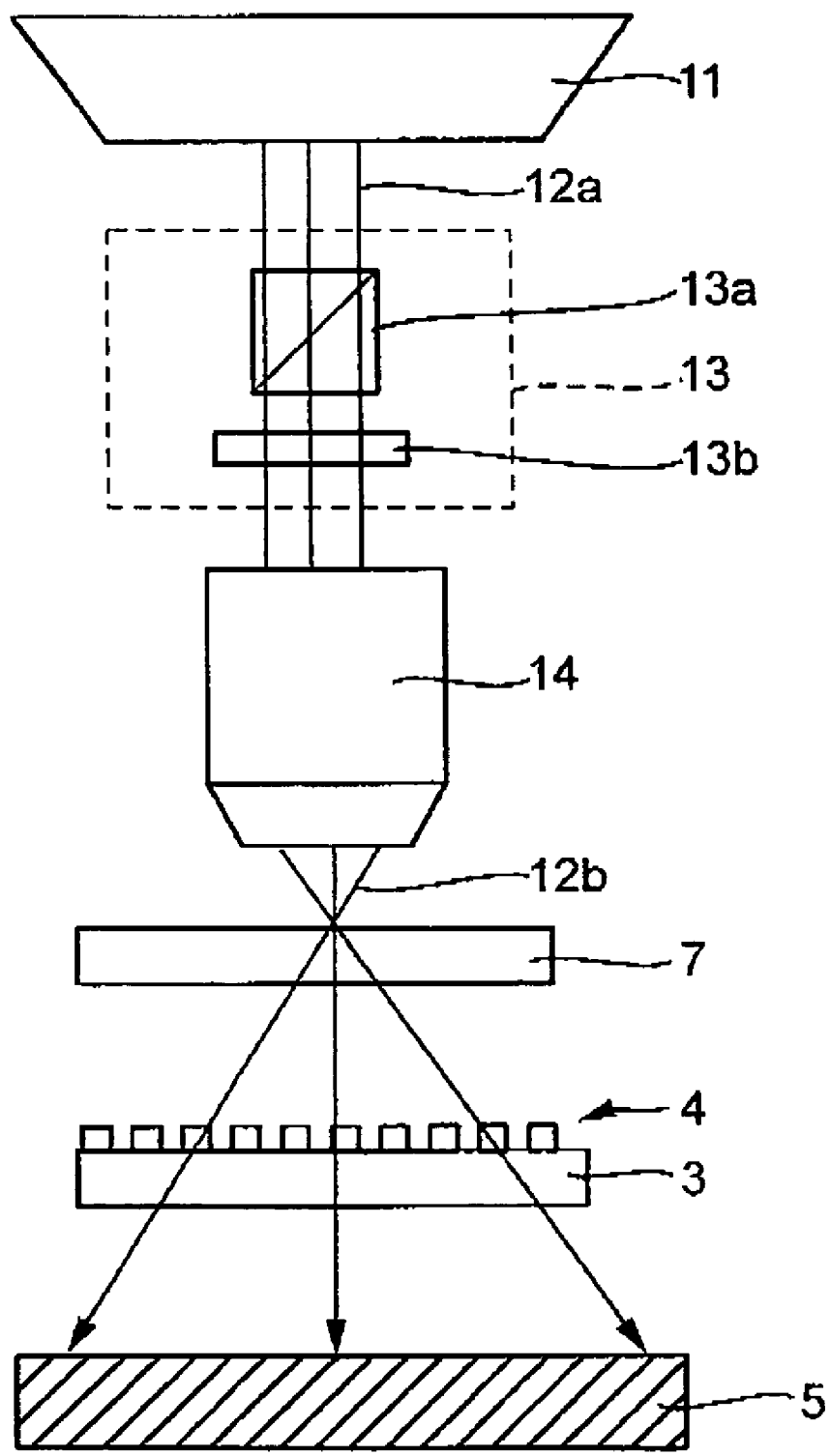
FIG. 4 shows a schematic side view of an arrangement for calibrating the device of FIG. 3.

FIG. 4 illustrates a calibration technique for the device of FIG. 3. As illustrated in FIG. 4, for this purpose a suitable, conventional illuminating system 11 provides a quasi-parallel beam 12a whose wavelength corresponds to the operating wavelength of the device for examining the state of polarization that is to be calibrated, of the imaging system 8 measured by said device.

An arbitrarily, defined state of polarization is set for the beam 12a by means of the generator 13 for the state of polarization. For this purpose, the generator 13 for the state of polarization comprises, for example, a rotatable polarization beam splitter 13a and a rotatable retardation plate 13b of conventional type. Subsequently, the quasi-parallel beam whose state of polarization is defined in such a way is reshaped by means of a suitable high-aperture optical system 14, for example a microscope objective, into a corresponding convergent beam 12b. The latter is coupled into the device for examining the state of polarization, that is to say it is irradiated onto the birefringent element 7, in order subsequently to traverse the polarizing grating 3, 4 and fall into the detector element 5. The structural pattern recorded by the detector element 5 then serves as reference pattern belonging to the said state of polarization.

The calibration operation is repeated for the various defined states of polarization that are set with the aid of the generator 13 for the state of polarization, and so upon conclusion of this calibration operation a set of reference patterns are present without belonging to the various prescribed states of polarization. These reference patterns can then be used in the evaluation of the structural patterns, recorded by the detector element 5, in the measurement mode of the device of FIG. 3, that is to say in the reconstruction of the influence of the state of polarization that is being sought and is caused by the imaging system 8, in a way corresponding to the evaluation method in the conventional OBPI method.

Instead of the experimental calibration method described, the images of structural patterns, required for evaluation, are defined states of polarization can also be determined by a computational simulation if the polarization-optical properties of the optical components used in the device are known with sufficient accuracy.

If required, a possible present, non-rotationally symmetrical influencing of the state of polarization by the microobjective 14 can be eliminated in the calibration of the device for examining the state of polarization by averaging out. For this purpose, a number of calibration measurements are carried out for a respectively set state of polarization given various rotary positions of the microobjective 14 with reference to this optical axis, and the results of these measurement operations are averaged.

The invention claimed is:

1. A device for polarization-specific examination of an optical system having
a detector part with polarization detector means for recording an exit state of polarization of radiation emerging from the optical system, wherein
the polarization detector means include a polarizing grating structure,
the detector part comprises a periodic diffraction structure, and
the polarizing grating structure is arranged in a beam path upstream or downstream of the periodic diffraction structure.

2. The device as claimed in claim 1, wherein the device is set up for polarization-specific examination of an optical imaging system, and wherein the periodic diffraction structure is arranged substantially in an image plane of the imaging system, and/or the polarizing grating structure is arranged close to the image plane.

3. The device as claimed in claim 1, wherein the polarizing grating structure and the periodic diffraction structure are arranged on a common carrier, one of the two structures being arranged on a front side of the carrier, and the other being arranged on a rear side of the carrier.

4. The device as claimed in claim 1, wherein a wavelength of the radiation is below approximately 400 nm.

5. The device as claimed in claim 4, wherein the wavelength of the radiation is between approximately 140 nm and approximately 200 nm.

6. The device as claimed in claim 4, wherein the wavelength of the radiation is below 140 nm.

7. The device as claimed in claim 1, wherein the device determines an influencing of the state of polarization of the radiation by the optical system.

8. A device for polarization-specific examination of an optical system having
   a detector part with polarization detector means for recording an exit state of polarization of radiation emerging from the optical system, wherein
   the polarization detector means include a polarizing grating structure, and
   the device is a shearing interferometry, point diffraction interferometry, Shack-Hartmann or Litel type device, and/or the device is set up for a pupil-resolved determination of an influencing of the state of polarization of radiation by a microlithographic projection objective.

9. The device as claimed in claim 8, wherein the device determines the influencing of the state of polarization of the radiation by the microlithographic projection objective.

10. The device as claimed in claim 8, wherein the detector part comprises a periodic diffraction structure, and the polarizing grating structure is arranged in a beam path upstream or downstream of the periodic diffraction structure.

11. The device as claimed in claim 8, wherein the device is set up for polarization-specific examination of an optical imaging system, and wherein the periodic diffraction structure is arranged substantially in an image plane of the imaging system, and/or the polarizing grating structure is arranged close to the image plane.

12. The device as claimed in claim 8, wherein the polarizing grating structure and the periodic diffraction structure are arranged on a common carrier, one of the two structures being arranged on a front side of the carrier, and the other being arranged on a rear side of the carrier.

13. The device as claimed in claim 8, wherein a wavelength of the radiation is below approximately 400 nm.

14. The device as claimed in claim 13, wherein the wavelength of the radiation is between approximately 140 nm and approximately 200 nm.

15. The device as claimed in claim 13, wherein the wavelength of the radiation is below 140 nm.

16. A device for polarization-specific examination of an optical system having
   a detector part with polarization detector means for recording an exit state of polarization of radiation emerging from the optical system, wherein
   the polarization detector means include a polarizing grating structure, and
   the optical system is a microlithography projection objective.

17. The device as claimed in claim 16, wherein the device determines an influencing of the state of polarization of the radiation by the optical system.

18. The device as claimed in claim 16, wherein the detector part comprises a periodic diffraction structure, and the polarizing grating structure is arranged in a beam path upstream or downstream of the periodic diffraction structure.

19. The device as claimed in claim 16, wherein the device is set up for polarization-specific examination of an optical imaging system, and wherein the periodic diffraction structure is arranged substantially in an image plane of the imaging system, and/or the polarizing grating structure is arranged close to the image plane.

20. The device as claimed in claim 16, wherein the polarizing grating structure and the periodic diffraction structure are arranged on a common carrier, one of the two structures being arranged on a front side of the carrier, and the other being arranged on a rear side of the carrier.

21. The device as claimed in claim 16, wherein the device is a shearing interferometry, point diffraction interferometry, Shack-Hartmann or Litel type device, and/or the device is set up for a pupil-resolved determination of an influencing of the state of polarization of the radiation by a microlithographic projection objective.

22. The device as claimed in claim 16, wherein a wavelength of the radiation is below approximately 400 nm.

23. The device as claimed in claim 22, wherein the wavelength of the radiation is between approximately 140 nm and approximately 200 nm.

24. The device as claimed in claim 22, wherein the wavelength of the radiation is below 140 nm.

25. A device for polarization-specific examination of an optical system having
   a detector part with polarization detector means for recording an exit state of polarization of radiation emerging from the optical system, wherein
   the polarization detector means include a polarizing grating structure, and
   a wavelength of the radiation is below approximately 400 nm.

26. The device as claimed in claim 25, wherein the device determines an influencing of the state of polarization of the radiation by the optical system.

27. The device as claimed in claim 25, wherein the device is set up for polarization-specific examination of an optical imaging system, and wherein the periodic diffraction structure is arranged substantially in an image plane of the imaging system, and/or the polarizing grating structure is arranged close to the image plane.

28. The device as claimed in claim 25, wherein the polarizing grating structure and the periodic diffraction structure are arranged on a common carrier, one of the two structures being arranged on a front side of the carrier, and the other being arranged on a rear side of the carrier.

* * * * *